United States Patent
Nittka et al.

(10) Patent No.: US 11,662,408 B2
(45) Date of Patent: May 30, 2023

(54) MR FINGERPRINTING HAVING ADJUSTABLE MEASUREMENT TIME

(71) Applicant: Siemens Healthcare GmbH, Erlangen (DE)

(72) Inventors: Mathias Nittka, Baiersdorf (DE); Gregor Körzdörfer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/394,587

(22) Filed: Aug. 5, 2021

(65) Prior Publication Data
US 2022/0043087 A1 Feb. 10, 2022

(30) Foreign Application Priority Data
Aug. 5, 2020 (DE) .......................... 102020209891.3

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/4824* (2013.01); *G01R 33/543* (2013.01); *G01R 33/5608* (2013.01)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

| 9,983,285 B2 * | 5/2018 | Hu ........................ G06T 11/006 |
| 2005/0037515 A1 * | 2/2005 | Nicholson ............ G01R 33/465 |
| | | 436/173 |

(Continued)

FOREIGN PATENT DOCUMENTS

| CN | 108968996 A * | 12/2018 | ........... A61B 5/0064 |
| DE | 102016208094 A1 * | 11/2017 | ........... G01R 33/288 |

OTHER PUBLICATIONS

Samsonov, Alexey et al: "POCS-enhanced correction of motion artifacts in parallel MRI"; Magnetic Resonance in Medicine; 2010; 63. Jg.; Nr. 4, pp. 1104-1110; DOI: https://doi.org/10.1002/mrm.22254.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

MR fingerprinting method in which an MR pulse sequence succession is output multiple times. The MR pulse sequence succession has MR pulse sequences of a same type output successively in time and differing in terms of a pulse sequence parameter that is varied according to a predefined scheme. During the first output, raw data from a region of interest (ROI) of an object is acquired in a short time interval by the raw data being acquired at a low information density. The total information density of the acquisition is increased with each repetition of the output. After the acquisition, image data from the ROI is reconstructed based on the acquired raw data. MR-parameter value datasets associated with reference image data and having MR parameter values, are determined by comparing the reconstructed image data with the reference image data. MR parameter maps are determined based on the determined MR parameter values.

20 Claims, 6 Drawing Sheets

(51) Int. Cl.
*G01R 33/56* (2006.01)
*G01R 33/54* (2006.01)

(58) Field of Classification Search
USPC .......................................... 324/309
See application file for complete search history.

(56) References Cited

U.S. PATENT DOCUMENTS

| | | | |
|---|---|---|---|
| 2009/0256570 A1* | 10/2009 | Zelinski | G01R 33/5612 |
| | | | 324/314 |
| 2013/0265049 A1* | 10/2013 | Fautz | G01R 33/543 |
| | | | 324/309 |
| 2015/0338491 A1* | 11/2015 | Popescu | G01R 33/56509 |
| | | | 324/309 |
| 2017/0146631 A1* | 5/2017 | Beck | G01R 33/5608 |
| 2018/0203082 A1* | 7/2018 | Griswold | G06F 16/56 |
| 2018/0364317 A1* | 12/2018 | Shen | G01R 33/543 |

OTHER PUBLICATIONS

Körzdörfer, Gregor et al: "Magnetic resonance field fingerprinting "Magnetic Resonance in Medicine; 2019; 81. Jg.; Nr. 4; pp. 2347-2359; DOI: https://doi.org/10.1002/mrm.27558.
Office Action dated May 25, 2021 for German Patent Application No. 102020209891.3.

* cited by examiner

MR FINGERPRINTING HAVING ADJUSTABLE MEASUREMENT TIME

FIELD OF THE DISCLOSURE

The disclosure relates to an MR fingerprinting method. In the MR fingerprinting method, an MR pulse sequence succession is output multiple times. The MR pulse sequence succession comprises a plurality of MR pulse sequences of the same type, which are output successively in time and differ in terms of at least one pulse sequence parameter, wherein the at least one pulse sequence parameter is varied according to one of the predefined schemes. The disclosure also relates to a controller. Furthermore, the disclosure relates to a magnetic resonance system.

BACKGROUND

In a magnetic resonance system, a main magnetic field system is normally used to apply a relatively high main-field magnetic field, for example of 1.5 Tesla or 3 Tesla or 7 Tesla, to the body to be examined. After the main field is applied, nuclei in the object under examination align themselves along the field by a non-zero nuclear magnetic dipole moment, also frequently known as spin. This collective behavior of the spin system is described by the macroscopic "magnetization". The macroscopic magnetization is the vector sum of all the microscopic magnetic moments in the object at a specific location. In addition to the main field, a gradient system is used to apply a magnetic field gradient, which defines the magnetic resonance frequency (Larmor frequency) at the particular location. Radiofrequency excitation signals (RF pulses) are then emitted via a radiofrequency transmit system by means of suitable antenna devices, with the aim of causing the nuclear spins of certain nuclei, which this radiofrequency field has excited to resonance (i.e. at the Larmor frequency that exists at the particular location), to be tipped by a defined flip angle with respect to the magnetic field lines of the main magnetic field. If such an RF pulse acts on spins that are already excited, then these can be tipped into a different angular position or even flipped back into an initial state parallel to the main magnetic field. Radiofrequency signals, known as magnetic resonance signals, are emitted resonantly when the excited nuclear spins relax, which signals are received by suitable receive antennas (also known as magnetic resonance coils or receive coils) then demodulated and digitized, and then processed further as "raw data" as it is known. The acquisition of the magnetic resonance signals takes place in the spatial frequency domain, what is known as "k-space", in which process, during measurement of e.g. a slice, k-space is traversed over time along a "gradient trajectory" (also called a "k-space trajectory") defined by the switching of the gradient pulses. In addition, the RF pulses must be emitted in a manner that is suitably coordinated in time. Finally, after further processing steps, which normally also depend on the acquisition method, a two-dimensional Fourier transform can be used to reconstruct the desired image data from the raw data acquired in this way.

Image data has the advantage that it is visually descriptive directly for medical personnel, and is easily accessible in terms of orientation for people trained in anatomy. Nonetheless, it often leaves the person carrying out the assessment with great scope for interpretation, and at least as a pictorial representation tends to allow a qualitative analysis.

Alongside MR imaging, there are also now MR examination techniques which involve, instead of generating representational image data, obtaining MR parameters which can be determined quantitatively from a region of interest, namely MR fingerprinting.

Thus MR fingerprinting is an approach aimed at quantitative examination using magnetic resonance signals in order to be able to determine simultaneously a plurality of MR parameters efficiently. MR fingerprinting comprises any number of degrees of freedom for specific aspects. One example application relates to determining T1 and T2 relaxation times.

The T1 relaxation time refers to the time that the magnetic moments, aligned in a main magnetic field $B_0$, require, after deflection by an RF pulse (radiofrequency excitation pulse) into the x-y plane perpendicular to the main field $B_0$, to return to the initial orientation again, i.e. to the z-direction, thereby restoring the original total magnetic moment in the z-direction.

The T2 relaxation time refers to the time taken by the magnetic moments, which have been deflected into the x-y plane, to lose their magnetization resulting from their phase coherence. In other words, the T2 relaxation time is the time that is needed to reduce a magnetization in the x-y plane, which magnetization is produced by applying an RF pulse.

The MR fingerprinting method, however, is less tolerant than conventional MR imaging to disturbances, such as those caused by patient movements, for instance, because the radiologist performing the analysis has to rely on the stability and reliability of the quantitative results. In other words, artifacts or other image disturbances in the representational MR imaging are often easy to detect, meaning that the radiologist gets an immediate impression as to the quality and reliability of image data. In contrast, MR fingerprinting data is entirely abstract and therefore it is not so easy to identify erroneous examination data obtained using this method. Therefore, in the event of disturbances, a measurement must be discarded or discontinued because it is not possible retrospectively to localize or delimit, or often even identify, the effect of the disturbance. For example, it is highly likely that a measurement must be discarded and, if necessary, repeated, if a patient is unable to keep still during the entire measurement time, with a measurement time usually equaling between 3 and 10 minutes. Thus, if the patients cannot cooperate as required because of physical or mental impairments, expensive resources for the MR imaging are often "wasted" without it being possible to obtain examination data relevant to a diagnosis.

Attempts have been made previously to reduce the susceptibility of the MR fingerprinting method to errors by switching from a particularly sensitive two-dimensional excitation of the region of interest to a three-dimensional excitation. Attempts have also been made to use a camera to detect the head movement of a patient and to perform a correction in real time, or to detect the head movement of the patient at least retrospectively and then to discard and, if necessary, re-measure, the data concerned.

SUMMARY

The object of the present disclosure is to develop an MR fingerprinting method that is less susceptible to errors than conventional approaches and that can be used to perform an examination on an object under examination, for instance on a patient, more reliably.

In the MR fingerprinting method according to the disclosure, an MR pulse sequence succession is output repeatedly instead of just once. Said MR pulse sequence succession comprises a plurality of MR pulse sequences of the same type, which are output successively in time and differ in terms of at least one pulse sequence parameter, wherein the at least one pulse sequence parameter is varied according to a predefined scheme, preferably pseudo-randomly. Each of the plurality of MR pulse sequences then corresponds in the analysis to an "image" of a region of interest. Thus in total, the number of MR pulse sequences multiplied by the number of pulse sequence successions, or rather the number of repetitions of the output of the MR pulse sequence succession, determines the number of "images" to be analyzed later.

A pulse sequence parameter shall be understood to mean a parameter, or an associated parameter value, that describes the structure and timing of a pulse sequence and thereby influences the effect with regard to central imaging properties such as contrast, measurement field or resolution, measurement time or even sensitivity to interference effects. Examples of pulse sequence parameters are the flip angle, the repetition time, the echo time, the gradient moment, the frequency, and the phase of the RF pulses used, etc.

During the first output of the MR pulse sequence succession, raw data from a region of interest of an object under examination is acquired in a short time interval by the raw data being acquired at a low information density. In other words, the lower information density allows a reduction in the acquisition time because there is less information in total to be captured from the region of interest, and in MR imaging the acquisition time is correlated with the amount of information obtained. A time interval for the output and acquisition of raw data that is achieved by a reduction measure, i.e. by a reduction in the time length of the pulse sequence or pulse sequence succession, shall be understood to mean a short time interval. In other words, the reduction in the time interval for an output of a pulse sequence or pulse sequence succession is obtained by replacing a single conventional pulse sequence succession with a plurality of pulse sequence successions, wherein the individual pulse sequence successions occupy a shorter time span than the conventionally used single pulse sequence succession. A low or lower information density shall be an information density that is lower than the normal information density that would be achieved without modification when outputting the normal pulse sequence or pulse sequence succession. Thus during the output of a first pulse sequence succession, raw data is deliberately acquired at as low an accuracy or resolution as possible in order to carry out the first pulse sequence succession in the shortest possible time. In this case, the minimum requirements for the quality of the parameter maps resulting from the first pulse sequence succession are a limiting factor for reducing the time of the output of the first pulse sequence succession.

One possible way of reducing the time of a pulse sequence succession would also be to reduce the readout intervals, thereby reducing the signal-to-noise ratio, resulting in noisier images. This would likewise reduce the information content or the information density of the acquisitions.

The total information density of the acquisition is then increased with each repetition of the output of the MR pulse sequence succession.

The information density for the individual repetitions, not the total information density, can, but does not have to, increase. For example, it is possible that information is gained with every additional repetition of the output of the pulse sequence succession, for instance by sampling higher frequencies in k-space, and hence the total resolution is increased if the raw data associated with the higher frequencies in k-space is then combined with the raw data that is acquired in preceding time intervals and attributable to sampled k-space regions of lower frequencies.

Additional information can then be obtained incrementally with the additional time intervals for the repetition of the output of the MR pulse sequence succession. The total examination duration thus gets longer with every repetition, and the information density acquired in k-space increases.

It is also possible that the time interval for the output of the pulse sequence succession and/or of a pulse sequence of the pulse sequence succession is extended in time for the at least one repetition, preferably for a plurality of repetitions, especially for each repetition of the output of the MR pulse sequence succession, in order to be able to sample in the particular time interval a more extensive region of k-space and hence to increase the information density in each case. If the time interval is extended for as many repetitions as possible, the redundancy of the sampling or undersampling of k-space is increased, because certain sub-regions of k-space, in particular the inner regions of k-space, are sampled repeatedly. Certain redundancies in the acquisition of the raw data when the sampling is repeated in each time interval can also be used to make the reconstruction based on undersampled raw data more robust.

Raw data and hence also parameter maps of ever greater resolution or accuracy are thereby produced with every repetition of the output of the pulse sequence succession. The parameter map from the first pulse sequence succession, or from the first output of the pulse sequence succession, can therefore be considered as a kind of fallback position for the case in which the object under examination, preferably a patient, moves during the output of the subsequent pulse sequence successions or during the repetition of the output of the pulse sequence succession. After the acquisition, image data from the region of interest is reconstructed on the basis of the acquired raw data.

In addition, the reconstructed image data is compared with reference image data. The comparison can be performed voxel by voxel, for instance. In this case, a multiplicity of image values are meant to be assigned to one voxel, because of course the fingerprinting method comprises a plurality of successions of MR acquisitions from the region of interest.

In addition, MR-parameter value datasets associated with reference image data, which datasets comprise a plurality of MR parameter values and are preferably read from a database, are determined by comparing the reconstructed image data with the reference image data. Besides using a database, a neural network can also be implemented for generating the reference image data and the MR parameter values associated therewith. Finally, a plurality of MR parameter maps are also determined on the basis of the determined MR parameter values.

The determined parameter maps can then be used for a diagnosis or assessment of the interior of an object under examination.

The procedure according to the disclosure advantageously allows a short minimum measurement duration until a valid result is already attained, for instance even when the object under examination, for example a patient, can keep still only briefly because of a painful condition, which would necessitate discontinuing a longer conventional image acquisition. In order to reduce the minimum measurement duration, the total measurement time is distributed over a plurality of pulse sequence successions rather than over a single pulse sequence succession as is the case for the conventional procedure. The raw data captured during the output of the individual pulse sequence successions is undersampled, or undersampled to a greater degree, compared with the conventional procedure. Nonetheless, the staggering over a plurality of pulse sequence successions and the shorter time length for the output of the individual pulse sequence successions compared with a single conventional pulse sequence succession increase the likelihood of producing a usable acquisition or parameter maps to be derived therefrom before the patient moves, which would impair or even make unusable an acquisition comprising just one single pulse sequence succession.

Preferably, the undersampling is now selected so that, even for a disturbance-free acquisition, it is just possible, using only a predefined portion (preferably only one) of the total number of output pulse sequence successions, to produce parameter maps already of sufficient quality for a subsequent examination, assessment or diagnosis, in particular of sufficient resolution, sufficient contrast and sufficient signal-to-noise ratio.

Even if the patient moves after a relatively short time, in the event that at least one pulse sequence succession has already been output, there is already enough raw data available for an image reconstruction by virtue of the staggered mode of acquisition according to the disclosure. It is also possible in this case to produce a parameter map, albeit a slightly coarser parameter map. On the other hand, if the patient keeps still for longer, then raw data attributable to a larger number of pulse sequence successions can be captured, and image data can be reconstructed therefrom, and parameter maps can be obtained therefrom at a higher resolution or information density. This achieves a more flexible configuration of the measurement time of a fingerprinting method. In the most favorable case, high-quality method results are achieved, whereas for less cooperative patients, the measurement can be terminated early while nonetheless allowing diagnostically relevant results to be obtained, albeit at a correspondingly lower quality or resolution.

The controller according to the disclosure for a magnetic resonance system comprises a control unit for the repeated output of an MR pulse sequence succession. Said MR pulse sequence succession comprises a plurality of MR pulse sequences of the same type, which are output successively in time and differ in terms of at least one pulse sequence parameter, wherein the at least one pulse sequence parameter is varied according to a predefined scheme, preferably pseudo-randomly. The MR pulse sequence succession is designed such that raw data is acquired in a short time interval. This shortened time interval is achieved by the raw data being acquired at a low information density. Then the total information density of the acquisition is increased by re-outputting the pulse sequence succession using appropriately modified pulse sequence parameters.

As already mentioned, the time interval for at least one, preferably for more than one, more preferably for each, repetition of the output of the MR pulse sequence succession is extended, with the information density of the acquisition, or the information content, being increased in each case. Part of the controller can also be a raw-data acquisition interface for capturing raw data from a region of interest of an object under examination, and a disturbance detection unit for monitoring the region of interest for a movement of the object under examination that disturbs the acquisition. The disturbance detection can be performed, for example, using a camera, a navigator or retrospectively. The navigator involves a series of additional pulse sequences, which are output with the aim of registering the position and position change of a region of interest, or a portion thereof, during a movement of the object under examination. The controller according to the disclosure also has a reconstruction unit for reconstructing image data from the region of interest on the basis of the raw data that was preferably acquired without disturbance, and a comparison unit for determining MR-parameter value datasets associated with reference image data that most closely matches the reconstructed image data. The MR-parameter value datasets comprise a plurality of MR parameter values from a database, and the comparison involves comparing the reconstructed image data with the reference image data. A map generation unit for producing a plurality of MR parameter maps on the basis of the determined MR parameter values is also part of the controller according to the disclosure. The controller according to the disclosure shares the advantages of the MR fingerprinting method according to the disclosure.

The magnetic resonance system according to the disclosure must have, in addition to a main magnetic field system, which is used to apply a main-field magnetic field in the patient measurement space in the usual manner, and the controller according to the disclosure for controlling the main magnetic field system, also a transmit antenna system having a radiofrequency transmit apparatus, a gradient system comprising a plurality of gradient coils and having a gradient system interface, and a receive antenna system having a radiofrequency receive apparatus. The magnetic resonance system according to the disclosure shares the advantages of the MR fingerprinting method according to the disclosure.

Parts of the controller according to the disclosure, in particular the disturbance detection unit, the reconstruction unit, the comparison unit and the map generation unit, can be implemented preferably in the form of software on a suitable programmable controller of a magnetic resonance system having appropriate storage capabilities. The radiofrequency transmit apparatus, the gradient system interface and the radiofrequency receive apparatus can also be implemented at least in part in the form of software units, although other units of these components are pure hardware units, for instance a radiofrequency amplifier, the radiofrequency transmit apparatus, a gradient pulse generation apparatus of the gradient system interface or an analog/digital converter of the radiofrequency receive apparatus, etc. An implementation largely in software, in particular of the units mentioned, has the advantage that even magnetic resonance system controllers already in use can be easily upgraded by a software update in order to work in the manner according to the disclosure. In this respect, the object is also achieved by a computer program product, which is stored in a portable memory and/or is provided for transfer via a network and hence can be loaded directly into a memory of a programmable magnetic resonance system controller, and which contains program segments in order to perform all the steps of the MR fingerprinting method according to the disclosure when the program is executed in the controller.

Said computer program product may comprise in addition to the computer program, if applicable, extra elements such as e.g. documentation and/or extra components, including hardware components, such as e.g. hardware keys (dongles etc.) for using the software.

For transfer to the controller and/or for storage on, or in, this controller, a computer-readable medium, for instance a memory stick, a hard disk or any other portable or permanently installed data storage medium can be used, on which are stored the program segments of the computer program, which program segments can be downloaded and executed by a processing unit of the controller. For this purpose, the processing unit can have, for example, one or more interacting microprocessors or the like.

The dependent claims and the following description each contain particularly advantageous aspects and developments of the disclosure. In particular, the claims in one category of claims can also be developed in a similar way to the dependent claims in another category of claims. Furthermore, within the scope of the disclosure, the various features of different exemplary aspects and claims can also be combined to create new exemplary aspects.

The region of interest is preferably monitored for a movement that disturbs the acquisition. The monitoring can take place simultaneously, or can also be carried out retrospectively, i.e. as part of a subsequent analysis of the data captured during the fingerprinting method, whether it be image data, raw data, video data or other measurement data. The reconstruction of image data can advantageously be confined to reconstructing on the basis of unimpaired image data.

It is also possible, however, that during the reconstruction, the reconstruction software generates after each imaging cycle a set of new parameter maps that can be obtained using the latest raw data available.

The user must then personally decide which data to use and which data to discard, for instance by a comparison of individual images in a pulse sequence succession. It can be determined in the comparison when there is an implausible change in values or when an obvious movement occurs in the image. The image data affected by the movement and, if applicable, the subsequent image data is then not used for a later analysis or diagnosis because it risks being misinterpreted.

In the MR fingerprinting method according to the disclosure, the low information density during the first output of the MR pulse sequence succession is preferably achieved by confining the acquisition to low frequencies in k-space. The low frequencies in k-space lie in the center of k-space. Sampling of the center of k-space already comprises the contrast information and information about coarsely resolved structures. It is advantageously possible using the raw data that has been sampled in the center of k-space to obtain already a less highly resolved image of a region of interest.

Particularly preferably in the MR fingerprinting method according to the disclosure, confining to the low frequencies in k-space is achieved by shortening a sampling trajectory in k-space. For example, when a spiral trajectory is used to acquire raw data in k-space, the spiral arms thereof are shortened. The measurement time needed for generating a parameter map can advantageously be reduced.

It is also preferred in the MR fingerprinting method according to the disclosure to achieve the reduction in the information density by reducing the k-space coverage, i.e. by increasing the undersampling. For example, when a spiral trajectory is used for k-space sampling, some of the spiral arms are not sampled; preferably only half of the spiral arms are sampled. A "spiral arm" shall be understood to mean in this context individual images, or pulse sequences of a pulse sequence succession that are assigned to these images. A single spiral arm of this type normally covers only a fraction of k-space which is required for a complete image. Only the progression in time over a plurality of pulse sequences of a pulse sequence succession completes k-space by means of the incremental rotation of the spiral arm. If then the angle of rotation is increased, for instance from measurement to measurement, this equates to increased undersampling, i.e. the spatial/temporal information is reduced at the cost of the information content (e.g. increased image noise, accuracy of the parameters only possible for reduced parameter step size/resolution, etc.). This measure allows an additional reduction in the measurement time needed to produce a parameter map without a further reduction in size of the sampled k-space region, or in other words a further reduction in the contrast or resolution of the image data needed for the parameter map.

It is also preferred in the MR fingerprinting method according to the disclosure to adjust the reference image data in the database to the lower information density by acquiring the reference image data at an image density equal to the information density of the particular output cycle. If alternatively the reference image data is provided by a neural network instead of by a database, then different neural networks are also provided for different output cycles. Advantageously, reference data corresponding to the different information density of each pulse sequence succession is also stored in the database, so that this data can be compared more easily with the reconstructed image data. This increases the likelihood that the correct reference image data is determined in the comparison, and hence also the parameter maps are produced correctly.

It is also preferred in the MR fingerprinting method according to the disclosure to achieve the shortened time interval for the acquisition of the raw data by reducing the repetition time of the individual MR pulse sequences. A reduction in the repetition time results in a shorter total measurement time per pulse sequence succession for a constant number of pulse sequences per pulse sequence succession. A first parameter map of possibly lower resolution can thereby be obtained in a shorter measurement time.

Alternatively or additionally, it is highly preferable in the MR fingerprinting method according to the disclosure that the information density of the acquisition can be achieved by adjusting the resolution of the number of pulse sequences in a pulse sequence succession, and that the number of pulse sequences per pulse sequence succession can be increased for a higher information density. Thus a pulse sequence parameter in a first pulse sequence succession is varied at a lower resolution, or with coarser increments, than for a larger number of pulse sequences per pulse sequence succession, resulting in a correspondingly coarser parameter map. The parameter map does not have a coarser spatial resolution, however, but is coarser in terms of the increments in the parameter values. The two options mentioned above for reducing the information density can be combined in any way in order for the information content in the parameter maps to be sufficient for the given application. This hence achieves greater flexibility and adaptability in the reduction of the information density of the results of the fingerprinting method to suit an individual application.

It is also preferred in the MR fingerprinting method according to the disclosure that the monitoring of the region of interest is performed by simultaneous monitoring during the acquisition of the raw data. Said monitoring of the region of interest is used to identify movements of an object under examination, in particular of a patient. In the case of simultaneous monitoring during the MR acquisition, the acquisition can advantageously be discontinued immediately and directly if the object under examination has moved. Compared with retrospective movement identification, it is thereby possible to save time resources, which can be used for another MR acquisition by the same MR resonance imaging apparatus.

The region of interest is preferably monitored retrospectively on the basis of the acquired raw data. Retrospective identification of a movement of a patient can be performed, for example, by a consistency check between image data from successive pulse sequence successions. Since the low-frequency data is preferably also sampled for all the pulse sequence successions, this data can be used for a consistency check because it recurs in each pulse sequence succession. If inconsistencies are identified between the image data associated with different pulse sequence successions, then it can be assumed that the object under examination has moved. The raw data acquired following this movement, or image data reconstructed from this raw data, should then be discarded and not used for determining parameter maps.

It is particularly preferred in the MR fingerprinting method according to the disclosure to sample a spiral trajectory in k-space in order to acquire the raw data. A spiral trajectory has the advantage that it can be used to sample k-space particularly efficiently in order to produce parameter maps. This saves time in the acquisition. For a reduction in the information density, in the case of a spiral trajectory, the spiral arms are shortened and/or the number of sequentially sampled spiral arms is reduced.

The described procedure covers two different scenarios. In the first scenario, fewer images in total are produced, i.e. a pulse sequence succession comprises fewer pulse sequences. In a second scenario, increased undersampling, i.e. a lower coverage of k-space, is achieved by omitting spiral arms which would actually be required for complete k-space coverage. Both measures result in a shortened acquisition time, thereby reducing the risk that the patient moves even during the acquisition of the minimum amount of raw data needed for a parameter map.

The center of k-space is advantageously sampled despite this change. It is typical to start the sampling of spiral trajectories in the center of k-space, with the result that preferably for each of the pulse sequence successions, not just regions lying further out in k-space are sampled but also the center of k-space is always re-sampled. This redundancy is advantageous because the reconstruction on the basis of possibly undersampled raw data is thereby made more robust, similar to the use of what are known as dual-density trajectories. As already mentioned, the redundancy can also be used for retrospective detection of a movement of the object under examination.

It is also preferred in the MR fingerprinting method according to the disclosure that one of the following trajectories can be sampled in order to acquire the raw data: a Cartesian trajectory; and a radial trajectory.

When using a Cartesian trajectory to sample k-space, the raw data can advantageously be transformed into the image data domain directly by means of a Fourier transform. The raw data sampled using a spiral trajectory, however, is preferably first converted into a Cartesian grid, for instance by interpolation, so that it can then be transformed efficiently into the image data by Cartesian Fourier transform, which involves significantly more processing effort. A similar procedure is also necessary for sampling using a radial trajectory in order to be able to perform a Fourier transform into the image data domain.

As already mentioned, the information density of the raw-data acquisition can be changed by adjusting the number of pulse sequences in a pulse sequence succession. In this case, for a lower number of pulse sequences, a lower information density is achieved with a shorter acquisition time per pulse sequence succession. Conversely, the number of pulse sequences per pulse sequence succession is increased for a higher information density, contributing to pulse sequence successions that are longer in time and have improved information density and hence also to parameter maps that have a correspondingly higher resolution, or finer increments, in terms of the parameters.

It is also preferred in the MR fingerprinting method according to the disclosure that the MR parameter values comprise one of the following parameter types: the T1 relaxation time; the T2 relaxation time; the susceptibility; the magnetization transfer; the $B_0$-field inhomogeneity; diffusion measurement data; and the off-resonance frequency.

Suitable MR pulse sequences are selected according to the type of MR parameter values to be obtained in order to be able to determine these values. For example, MR diffusion imaging sequences require diffusion gradients in order to determine the diffusion behavior in a region of interest. Advantageously, however, it is also possible to measure a plurality of MR parameter values simultaneously in order to save time. Particularly advantageously it is possible to determine, in a first MR pulse sequence succession having a particularly short acquisition time, only the especially important MR parameters, for instance the T1 relaxation time and the T2 relaxation time, and the acquisition time can thereby be kept particularly short. Additional MR parameters such as, for instance, the susceptibility, the magnetization transfer, etc., which require a correspondingly longer time to capture the necessary raw data, are determined in pulse sequence successions that are output later. The captured data that is most needed can advantageously be captured first in a short time, and therefore it is particularly likely that the patient or the object under examination has still not moved.

The magnetization transfer describes a mechanism that causes changes to relaxation times in the presence of macromolecules. This effect can be influenced by special RF pulses and is therefore well-suited to the fingerprinting approach. This variable is useful as an additional parameter for describing the biological tissue composition.

The off-resonance frequency, i.e. a divergence from the resonant frequency, is determined for the reason that changes in frequency can provide information about different biochemical environments of the protons, for instance. The most important use is the separation of fat and water. This is because protons in fatty tissue have a different precession frequency to protons in an aqueous environment.

Ideally, the changes to the sequence parameters from echo to echo have an equal influence on all the MR parameters during the entire acquisition time, thereby encoding the MR parameters simultaneously. For example, in a (True-)FISP sequence, the continuous variation in the TR parameter influences the echo amplitude as a function of both the T1 relaxation and the T2 relaxation. In contrast, a FLASH sequence is sensitive only to the T1 relaxation time but not to the T2 relaxation time.

In practice, however, it is often simpler or more effective if an MR fingerprinting pulse sequence is composed of segments having different sequence parameters (flip angle, TR variation, etc.) or even consists of a series of quite different sequence types, which each encode different MR parameters particularly effectively. The series need not be strictly sequential, but can also be performed with rapid changeovers, for instance from echo to echo, or with a change to another scheme occurring every N echoes. As another example, it is possible for almost every sequence type to modify the echo time TE slightly with every repetition, whereby information can be gained about the spectral distribution of the spins (e.g. susceptibility effects or for fat-water separation). It is known that the following MR parameters can be encoded particularly well using the following sequence types or contrast preparation techniques. These are typical examples, but there are also numerous alternative approaches:

T1: gradient echo sequences (e.g. FLASH, FISP, True-FISP), inversion recovery techniques;

T2: spin echo sequences, (True)FISP sequences;

Susceptibility: gradient or spin echo sequences with varying echo time TE;

Magnetization transfer: insertion of RF pulses having an excitation frequency that is offset by a few kilohertz;

$B_0$-field inhomogeneity: TrueFISP sequences with varying TR times;

Diffusion properties of the tissue: insertion of gradient moments of varying intensity;

Off-resonance properties of the tissue (in particular for fat-water separation): gradient or spin echo sequences with varying echo time TE.

BRIEF DESCRIPTION OF THE DRAWINGS

The disclosure is described again below in greater detail using exemplary aspects and with reference to the accompanying figures, in which.

DETAILED DESCRIPTION

Figure 1:
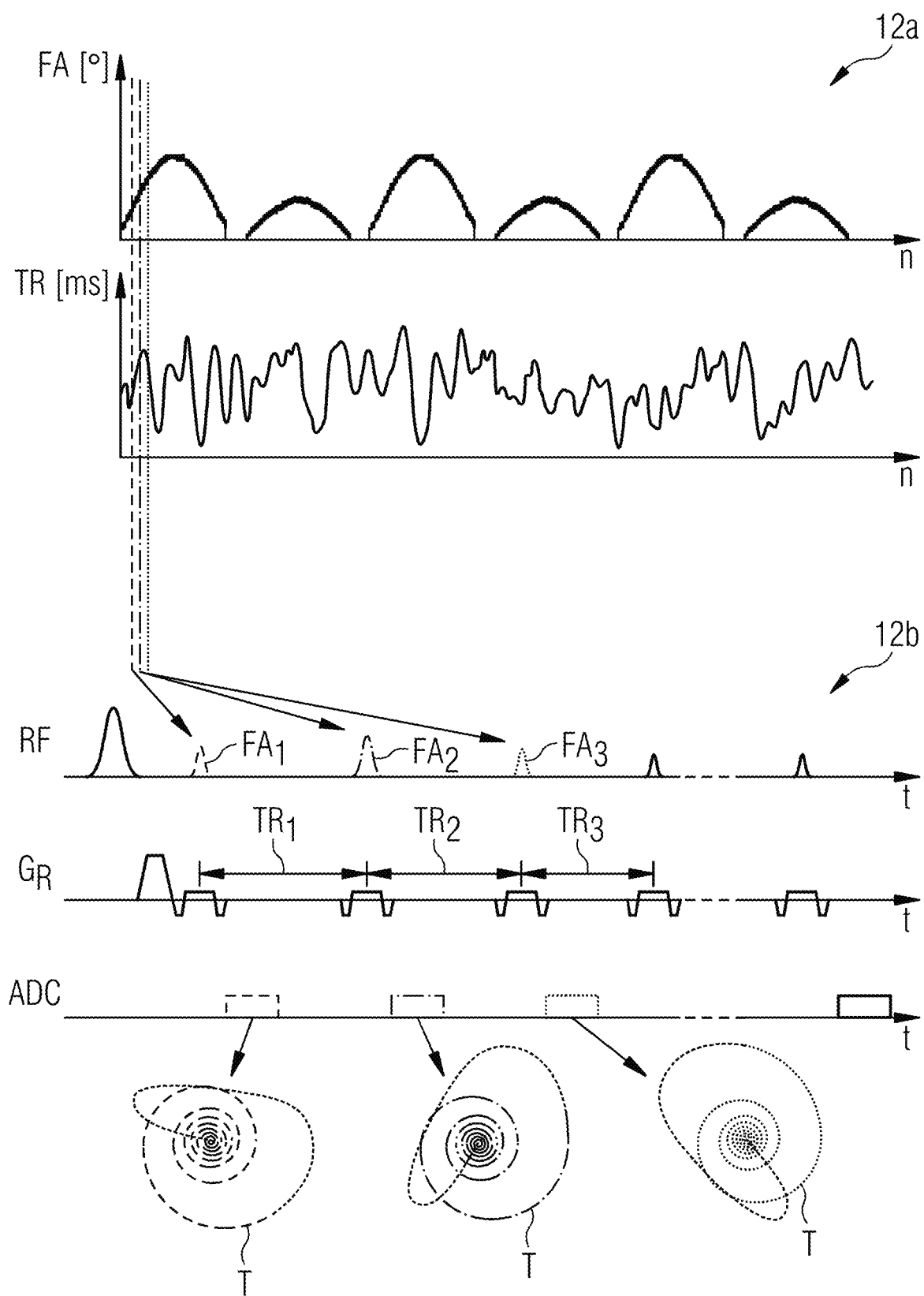
FIG. 1 shows a diagram containing two different randomly varied pulse sequence parameters, and a diagram depicting a pulse sequence that is output in order to realize the pulse sequence parameters shown in FIG. 1.

FIG. 1 shows two diagrams 12a, 12b, wherein a first diagram 12a depicts two different randomly varied pulse sequence parameters FA, TR, and a second diagram 12b illustrates a pulse sequence succession of an MR fingerprinting method. The first diagram 12a shows in a top line a random series of flip angle settings FA as a function of an image number n, and in a bottom line a random series of different repetition times TR as a function of the image number n. The pulse sequence parameters FA, TR are varied after each image acquisition of the fingerprinting method, resulting in a pulse sequence succession comprising a plurality of pulse sequences of the same type that differ in terms of said pulse sequence parameters FA, TR.

The second diagram 12b shows a pulse sequence succession that is output using the pulse sequence parameters illustrated in FIG. 1. In the diagram, a first line depicts RF pulses $FA_1$, $FA_2$, $FA_3$, which are used to realize the values FA shown in FIG. 1 for a flip angle of the longitudinal magnetization, which values are different for each pulse sequence of a pulse sequence succession.

In the second diagram 12b of FIG. 1, a second line depicts gradient pulses $G_R$, which are used for localization of the flip in the magnetization. The time of a sequence segment or of a pulse sequence comprising one gradient and one RF pulse is also referred to as the repetition time TR1, TR2, TR3. The repetition time is likewise varied between the pulse sequences of a pulse sequence succession, in accordance with the settings shown in FIG. 1.

A bottom line of the second diagram 12b shown in FIG. 1 depicts readout windows ADC, in each of which a spiral trajectory T in k-space is sampled. The spiral trajectories T have different phases according to the flip angle and therefore differ in orientation.

Figure 2:
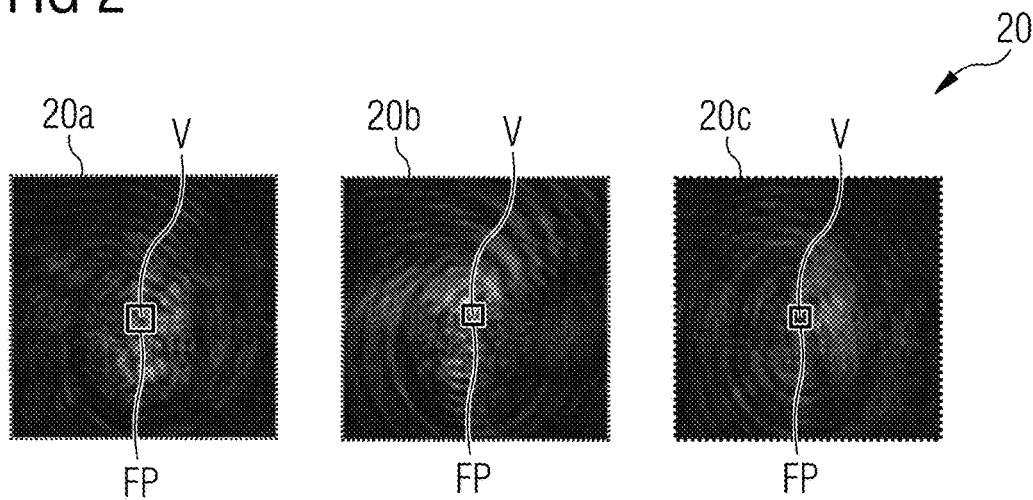
FIG. 2 shows a diagram depicting undersampled image data.

FIG. 2 shows a diagram 20 containing a plurality of undersampled images 20a, 20b, 20c, each of which is attributable to a different parameter set of repetition times TR. The three images 20a, 20b, 20c are limited in number to 3 purely for purposes of better illustration or clarity. They represent a plurality $n=n_1*n_2$ of images obtained by a plurality $n_2$ of pulse sequence successions, each containing a plurality $n_1$ of pulse sequences.

The same voxels V are extracted from each of the n images, and their associated intensity values, which are depicted as gray levels in FIG. 2, are combined into what is known as a fingerprint FP.

Figure 5:
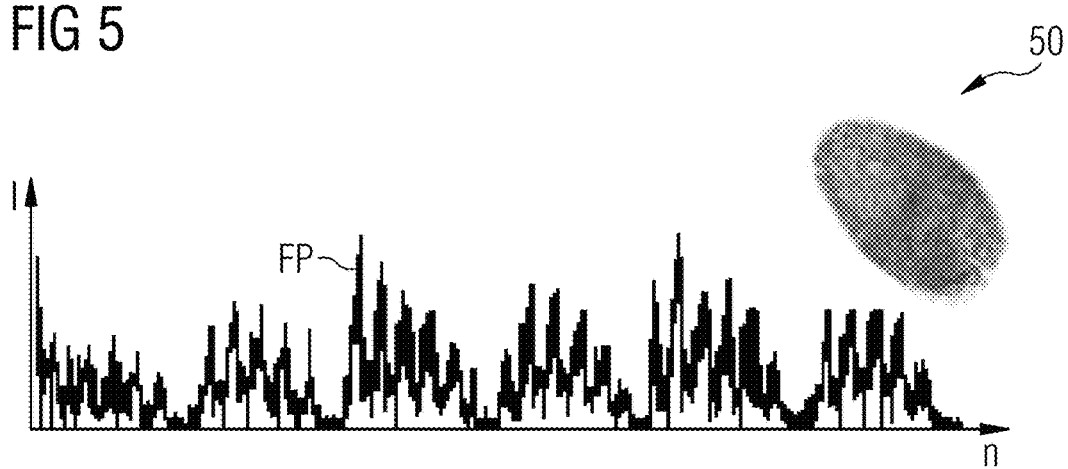
FIG. 5 shows a diagram depicting voxel intensities that have been obtained from the image data shown in FIG. 2.

The intensities I shown in FIG. 2 for different voxels V, or the fingerprint FP obtained therefrom, can be used for a comparison with reference data from a database in order to generate parameter maps. FIG. 5 shows such a fingerprint FP. Reference data for such a fingerprint, so reference fingerprint data RFP, is shown in FIG. 3.

Figure 3:
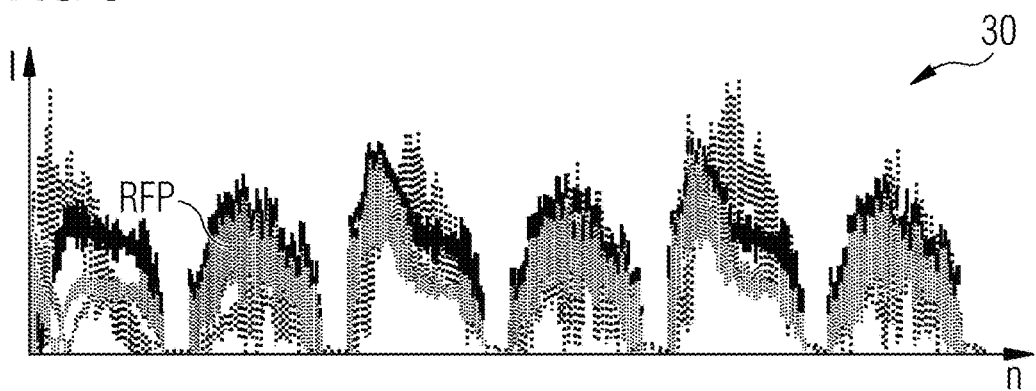
FIG. 3 shows a diagram depicting receive signals from different body materials from a database.

FIG. 3 shows a diagram 30 depicting intensities I of simulated receive signals RFP from different body materials over a number n of the images or pulse sequences from a database. The simulated receive signals are calculated on the basis of the sequence parameters FA, TR shown in the top diagram of FIG. 1, and on the basis of additional sequence parameters that influence the signal curve during a measurement, and form in their totality (simulated signal curves for a large number of different tissue parameters, for instance different combinations of the T1 and T2 relaxation times) a database, also known as a dictionary. The illustration in FIG. 3 shows the signals for the stated sequence parameters for different body materials, which differ because of different T1 and T2 relaxation times. The simulated receive signals RFP shown in FIG. 3 can be considered to be candidate signals, which are compared in a subsequent comparison process with actually detected receive signals or their intensity curves I. The database is generated by means of a computer simulation, which simulates the behavior of the spins of a tissue under examination during an acquisition and hence can be used to predict a realistic signal evolution. The Bloch equations are normally used in order to simulate different effects of the output pulse sequence on the spins for a given set of tissue parameters. The information that can be obtained using MR fingerprinting is therefore dependent on how and what physical effects are simulated. The T1 and T2 times and the off-resonance, which refers to the divergence of the $B_0$ field, can be considered the basic parameters that can be simulated. Many other tissue properties can be simulated, however, for instance a partial volume, the diffusion behavior and the perfusion in a region of interest. The partial volume involves modeling a composition of a voxel from a plurality of partial volumes of different size that differ in their tissue composition. A typical application concerns determining the proportion of nerve fibers, i.e. myelin, in brain tissue, which is of interest in degenerative brain diseases, for instance.

Figure 4:
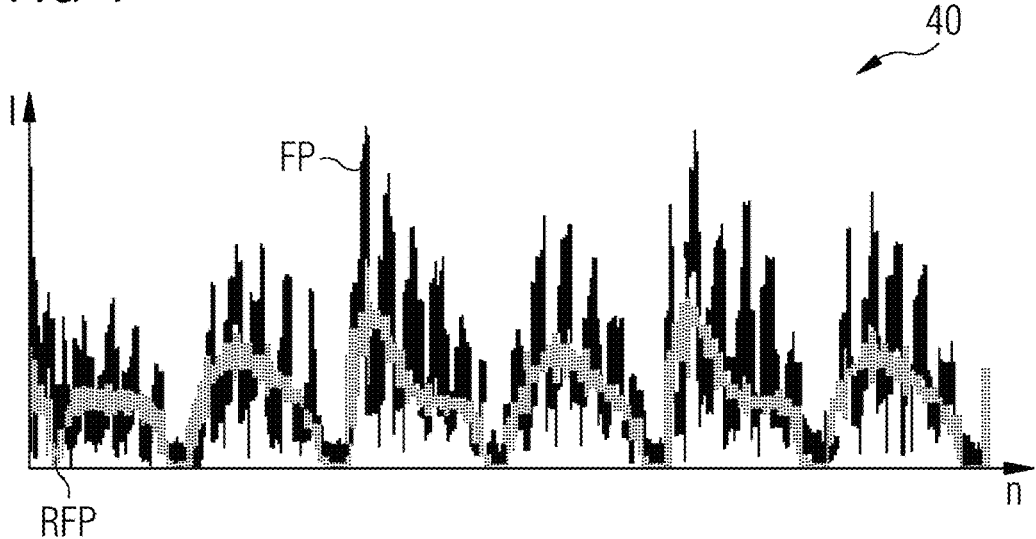
FIG. 4 shows a diagram depicting a comparison of the receive signals present in the database with measured receive signals.

FIG. 4 shows a diagram 40 illustrating a comparison of a reference fingerprint RFP held in the database, i.e. the simulated receive signals shown in FIG. 3, with a fingerprint FP produced by a measurement, such as that shown in FIG. 5. The receive signals measured for the fingerprint FP were obtained from the voxels shown in FIG. 2.

FIG. 5 depicts the pixelwise receive signals produced by the MR fingerprinting measurement method presented in FIG. 1, or in other words the fingerprint FP obtained therefrom.

Figure 6:
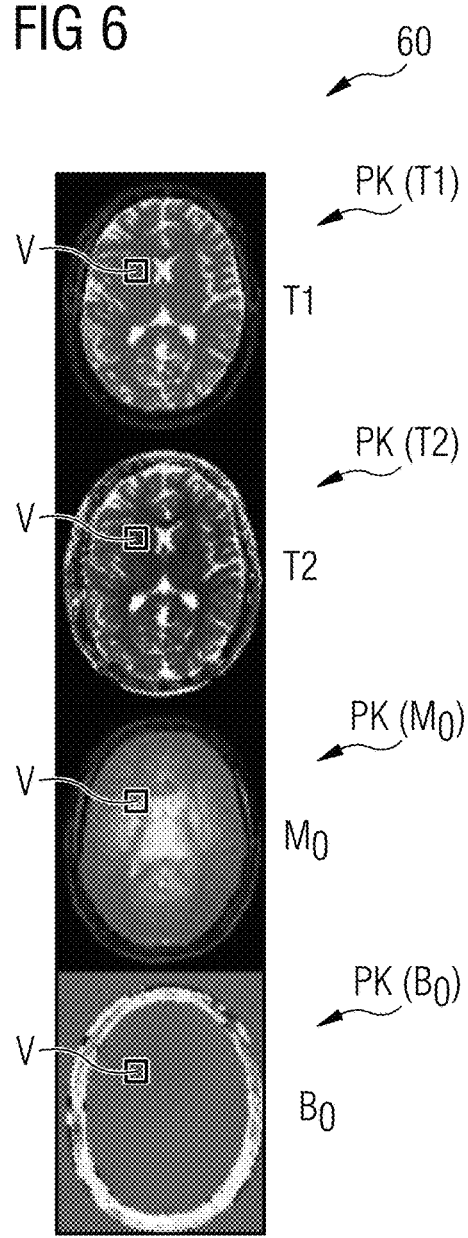
FIG. 6 shows a plurality of parameter maps that have been obtained on the basis of the comparison depicted in FIG. 4 with the voxel intensities shown in FIG. 6.

FIG. 6 depicts a plurality of parameter maps PK(T1), PK(T2), PK($M_0$), PK($B_0$) that have been obtained on the basis of the comparison shown in FIG. 4 of the fingerprint FP shown in FIG. 5 with the reference fingerprint RFP shown in FIG. 3. The parameter values T1, T2, $M_0$, $B_0$ of the parameter maps PK(T1), PK(T2), PK($M_0$), PK($B_0$) can be determined easily on the basis of the parameter values T1, T2, $M_0$, $B_0$ associated in the database with the relevant reference fingerprint RFP. For example, a first sub-diagram PK(T1) depicts a distribution of the parameter value T1, i.e. of the T1 relaxation time, in a cranium. A second sub-diagram PK(T2) depicts a distribution of the parameter value T2, i.e. of the T2 relaxation time, in a cranium. A third sub-diagram PK($M_0$) depicts a distribution of the longitudinal magnetization $M_0$ in a cranium. A fourth sub-diagram PK($B_0$) depicts a distribution of a parameter value of a main magnetic field $B_0$ in a cranium. A voxel V is labeled in each of the parameter maps PK(T1), PK(T2), PK($M_0$), PK($B_0$). This voxel V corresponds to the voxel V from which was extracted the measurement signal used for the fingerprint shown in FIG. 5.

Figure 7:
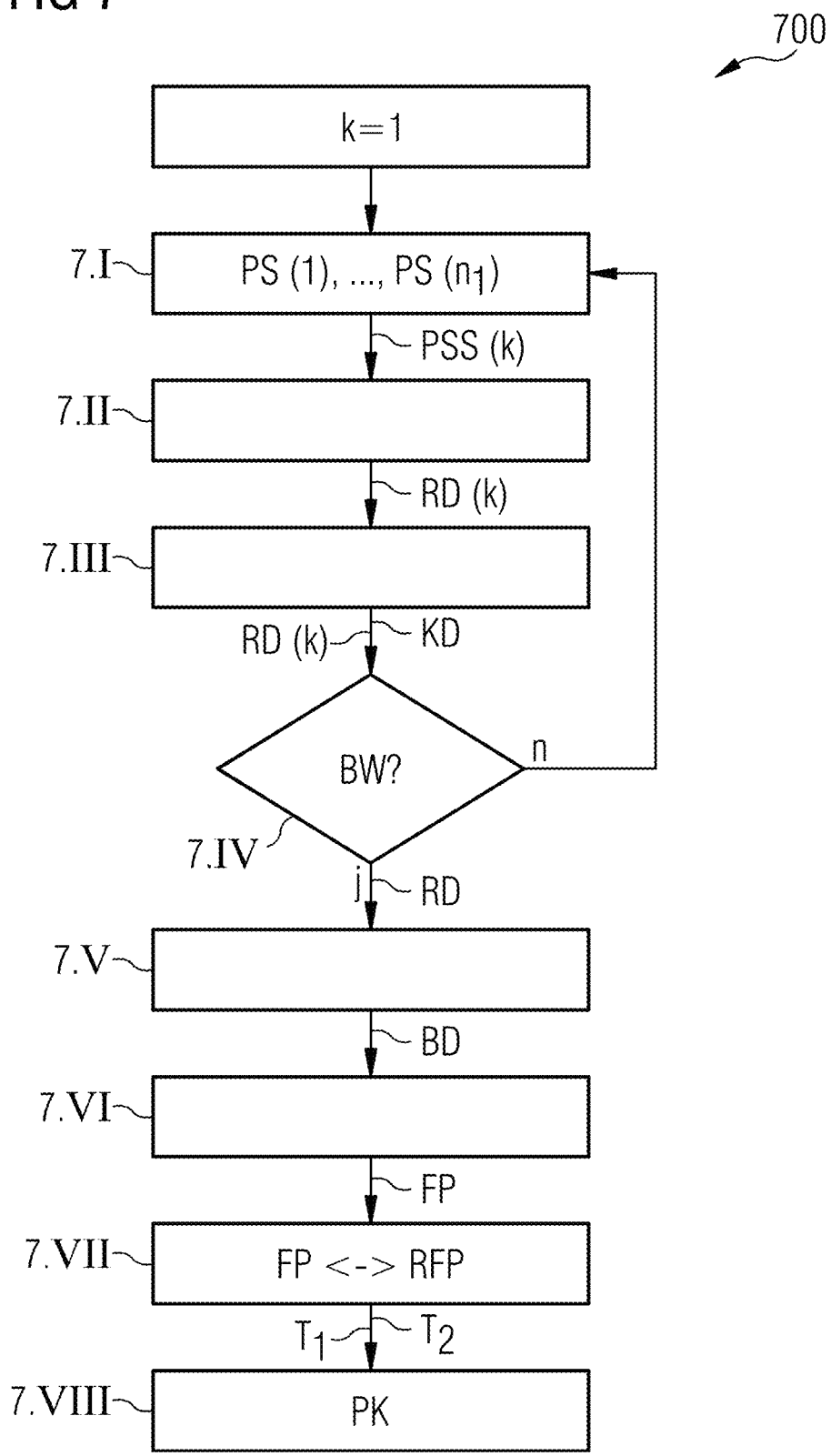
FIG. 7 shows a flow diagram illustrating a fingerprinting method according to an exemplary aspect of the disclosure.

FIG. 7 shows a flow diagram 700 illustrating an MR fingerprinting method according to an exemplary aspect of the disclosure. In step 7.I, a first MR pulse sequence succession PSS(1) is output initially as part of an MR fingerprinting acquisition. The first MR pulse sequence succession PSS(1) comprises a plurality of MR pulse sequences PS(i), where i=1, . . . , $n_1$, of the same type, which are output successively in time. The MR pulse sequences PS(i) differ in terms of at least one pulse sequence parameter FA, TR, with the at least one pulse sequence parameter being varied randomly.

During the first output of the MR pulse sequence succession PSS(1), raw data RD(1) is acquired from a region of interest ROI of an object under examination O in a short time interval $T_R$. The short or shortened time interval $T_R$ is achieved by shortening the trajectory used to acquire the raw data RD(1), in this exemplary aspect a spiral trajectory, and by reducing the number of sequentially acquired spiral arms. The repetition times TR of the individual pulse sequences PS(i) of the MR pulse sequence succession PSS(1) can be reduced by this measure. The shortening of the trajectory, however, also results in the data being acquired at a lower resolution, or just raw data RD of low spatial frequencies being captured.

In step 7.III, a camera is used to monitor whether the object under examination is lying still. The camera images KD undergo an automated motion analysis. For example, images that have been captured at different times are registered with one another. If no disturbance in the image acquisition occurs as a result of a movement by a patient, labeled in FIG. 7 by "n", the flow moves to step 7.I, and a pulse sequence succession is output again, this time containing pulse sequences having a slightly longer spiral trajectory compared with the first pass and a longer repetition time.

Then the two steps 7.II and 7.III are performed again. If in step 7.IV a movement BW is identified or detected in which the patient has moved too much, labeled in FIG. 7 by "j", the flow moves to step 7.V. In step 7.V, image data BD from the region of interest is then reconstructed on the basis of the raw data RD acquired without disturbance. Then, in step 7.VI, fingerprints FP are generated for each voxel of the image data BD. In addition, in step 7.VII, reference fingerprints RFP are compared with the fingerprints FP, and MR-parameter value datasets T1, T2, $\Delta B_0$ associated with the reference fingerprints RFP identified as a match are determined. Finally, in step 7.VIII, a plurality of MR parameter maps PK are generated from the determined MR-parameter value datasets T1, T2, $\Delta B_0$.

Figure 8:
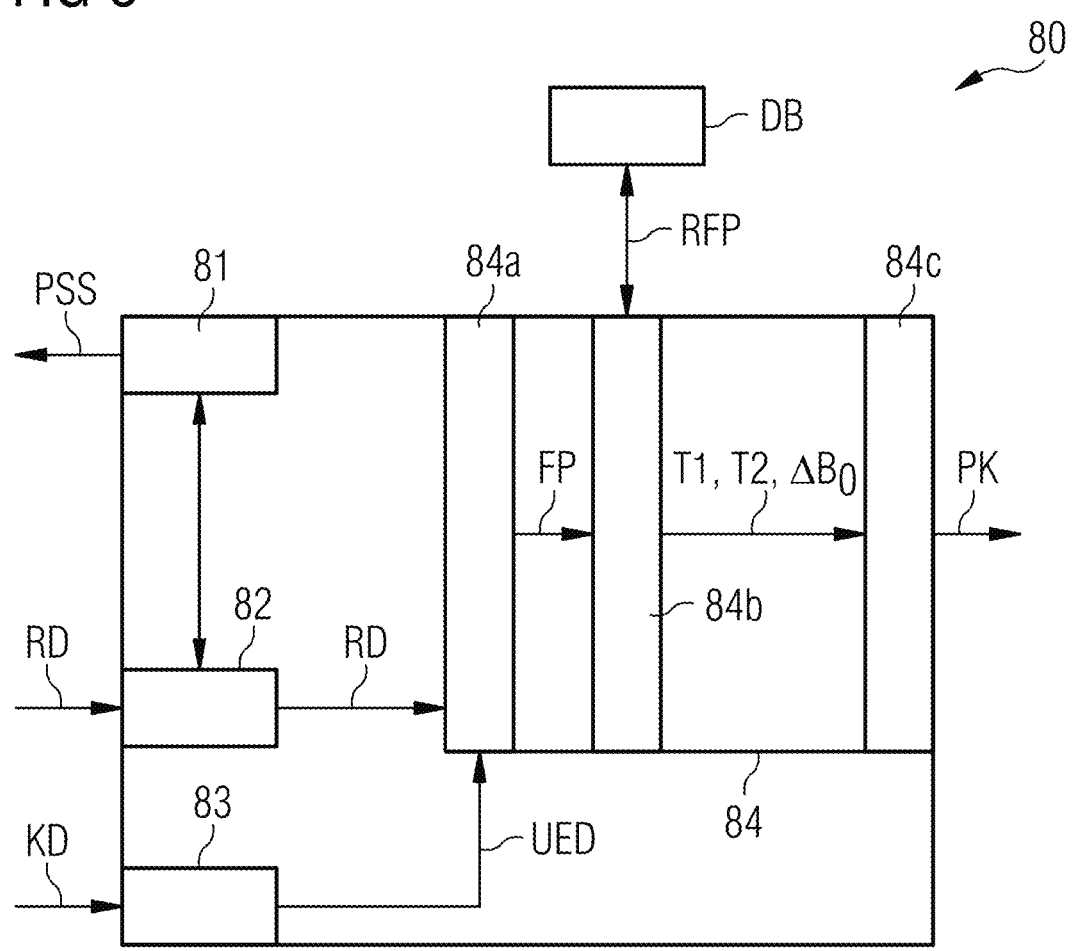
FIG. 8 shows a controller for a magnetic resonance system according to an exemplary aspect of the disclosure.

FIG. 8 shows schematically a controller 80 for a magnetic resonance system according to an exemplary aspect of the disclosure. The controller 80 comprises a control unit 81, which is designed to output repeatedly an MR pulse sequence succession PSS. Said MR pulse sequence succession PSS comprises a plurality of MR pulse sequences PS of the same type, which are output successively in time and differ in terms of at least one pulse sequence parameter TR, FA. The at least one pulse sequence parameter TR, FA is varied pseudo-randomly. The MR pulse sequence succession PSS is designed such that raw data RD is acquired in a short time interval by the raw data RD being acquired at a low information density, and the time interval is extended with each repetition of the output of the MR pulse sequence succession PSS, thereby increasing the information density of the acquisition in each repetition. Part of the controller 80 is also a raw-data acquisition interface 82 for capturing raw data RD from a region of interest of an object under examination O (see FIG. 9). The raw-data acquisition interface 82 and the control unit 81 are communicatively connected to each other in order to synchronize the image acquisition process. The controller 80 also comprises a disturbance detection unit 83 for monitoring the region of interest for a movement that disturbs the acquisition of the raw data RD. The disturbance detection unit 83 comprises a camera for capturing camera image data KD, and a monitoring-data analysis unit (not shown), which is used to analyze the camera image data KD for a movement of the object under examination and to transfer monitoring result data UED to an analysis unit 84, which is likewise part of the controller 80. The analysis unit 84 comprises a reconstruction unit 84a, which is designed to reconstruct image data BD from the region of interest on the basis of the raw data RD acquired without disturbance. The reconstruction unit 84a uses the reconstructed image data BD to produce fingerprints FP. The fingerprints FP are transferred to a comparison unit 84b, which is also part of the analysis unit 84. The comparison unit 84b is designed to compare the received fingerprints FP with reference fingerprints RFP. If reference fingerprints have been identified that most closely match the fingerprints FP determined by measurement, then MR-parameter value datasets T1, T2, $\Delta B_0$ associated with these reference fingerprints RFP, which datasets comprise a plurality of MR parameter values T1, T2, $\Delta B_0$, are read from a database DB and transferred to a map generation unit 84c, which is likewise part of the analysis unit 80. The map generation unit 84c is designed to determine a plurality of MR parameter maps PK on the basis of the determined MR parameter values T1, T2, $\Delta B_0$.

Figure 9:
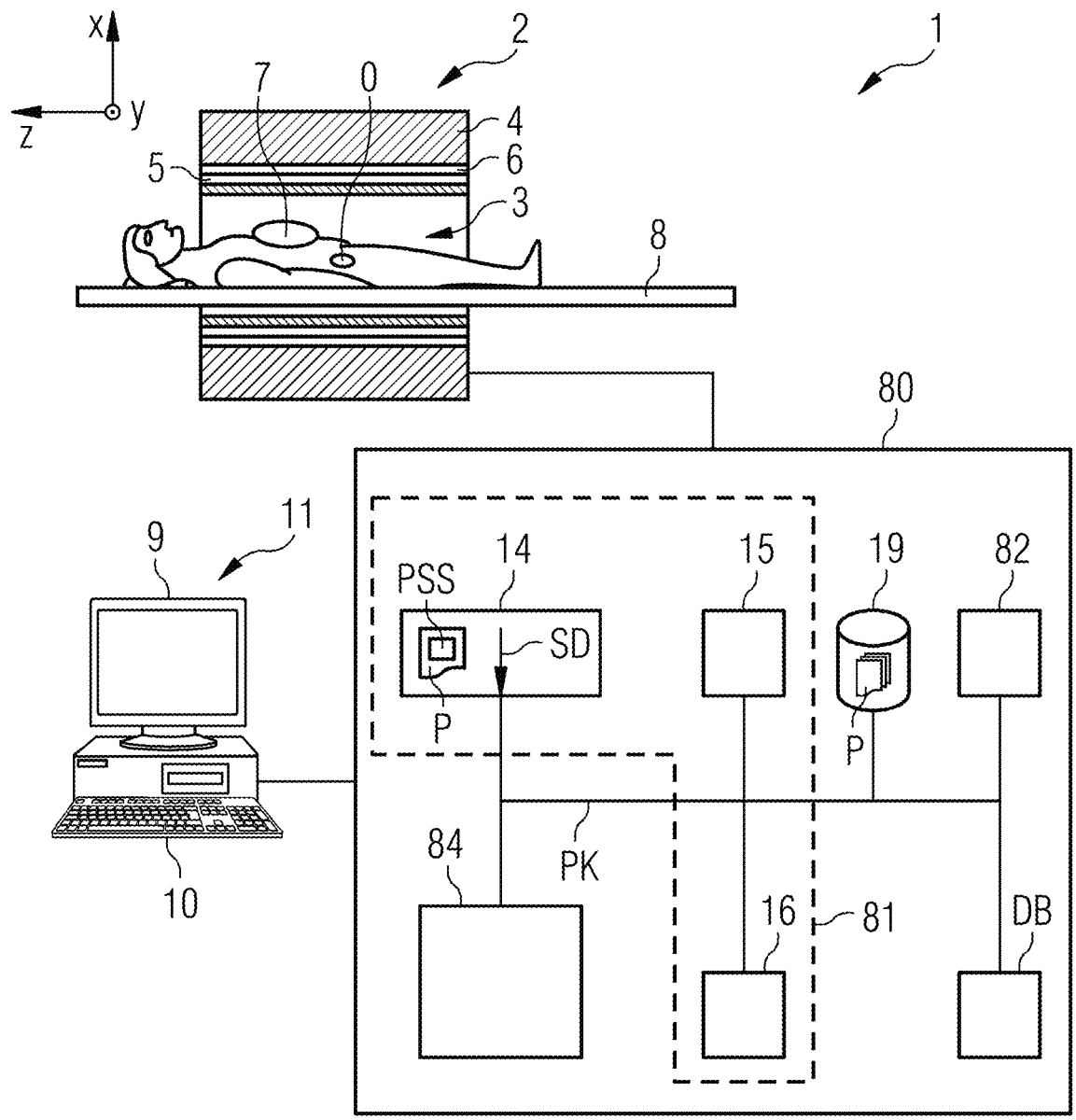
FIG. 9 shows a schematic diagram of an MR imaging system according to an exemplary aspect of the disclosure.

FIG. 9 shows a highly simplified diagram of a magnetic resonance imaging system 1. It comprises the actual magnetic resonance scanner 2 containing an examination space 3 or patient tunnel, in which is positioned, on a couch 8, a patient or person under examination, in whose body is located the actual object under examination O. Although the object under examination O is depicted in the torso in the example shown, MR fingerprinting is also often used for images of the brain, because it is particularly well suited to depicting neurological information.

The magnetic resonance scanner 2 is equipped in the usual manner with a main magnetic field system 4, a gradient system 6 and also an RF transmit antenna system 5 and an RF receive antenna system 7. In the exemplary aspect shown, the RF transmit antenna system 5 is a body coil that is fixed in the magnetic resonance scanner 2, whereas the RF receive antenna system 7 consists of local coils (represented in FIG. 9 by a single local coil) arranged on the patient or person under examination. In principle, however, the body coil can also be used as the RF receive antenna system, and the local coils can be used as the RF transmit antenna system, provided these coils can each be switched into different operating modes. The main magnetic field system 4 is designed here in the usual manner to generate a main magnetic field in the longitudinal direction of the patient, i.e. along the longitudinal axis of the magnetic resonance scanner 2, which axis extends in the z-direction. As is customary, the gradient system 6 comprises individually controllable gradient coils in order to be able to switch gradients in the x-, y- or z-direction independently of one another. The magnetic resonance scanner 2 also contains shim coils (not shown), which can have the usual design.

The magnetic resonance imaging system shown in FIG. 9 is a full-body system comprising a patient tunnel, into which a patient can be placed completely. In principle, however, the disclosure can also be used on other magnetic resonance imaging systems, for instance having a C-shaped enclosure that is open at the side. The only essential element is that suitable acquisitions of the object under examination O can be produced.

The magnetic resonance imaging system 1 also has a central controller 80, which is used to control the MR system 1. This central controller 80 comprises a control unit 81. The control unit 81 comprises a sequence control unit 14. This is used to control the series of radiofrequency pulses (RF pulses) and gradient pulses according to a selected pulse sequence PS, in this specific exemplary aspect a pulse sequence succession PSS, i.e. a series of a plurality of pulse sequences for acquiring a plurality of slices in a volume of interest of the object under examination within a measurement session. Said pulse sequence succession PSS can be specified and parameterized in a measurement protocol or control protocol P, for example. Different control protocols P for different measurements or measurement sessions are typically stored in a memory 19, and can be selected (and possibly modified if required) by an operator, and then used to perform the measurement. In the present case, the controller 80 contains pulse sequences for acquiring the raw data.

For the output of the individual RF pulses of a pulse sequence PS, the control unit 81 has a radiofrequency transmit unit 15, which generates, amplifies and feeds the RF pulses into the RF transmit antenna system 5 via a suitable interface (not presented in detail). The control unit 81 has a gradient system interface 16 for controlling the gradient coils of the gradient system 6 in order to switch the gradient pulses suitably according to the specified pulse sequence succession PSS. The gradient pulses, for instance diffusion gradient pulses or spoiler gradient pulses, can be applied via this gradient system interface 16. The sequence control unit 14 communicates with the radiofrequency transmit unit 15 and the gradient system interface 16 in a suitable manner, e.g. by sending out sequence control data SD, in order to implement the pulse sequence succession PSS.

The controller 80 also has a radiofrequency receive apparatus 82 (likewise communicating with the sequence control unit 14 in a suitable manner) in order to receive in a coordinated manner by means of the RF receive antenna system 7 magnetic resonance signals within the readout windows ADC defined by the pulse sequence succession PSS, and hence to acquire the raw data.

An analysis unit 84 here accepts the acquired raw data RD and generates parameter maps PK therefrom. The reconstruction of image data BD, which reconstruction is needed to generate the parameter maps, is usually performed on the basis of parameters which can be specified in the measurement protocol or control protocol P concerned. These parameter maps can then be stored in a memory 19, for example.

The principles of how suitable raw data RD can be acquired by applying RF pulses and switching gradient pulses, and how MR images BD can be reconstructed from said raw data, are known in detail to a person skilled in the art and therefore are not explained further here.

The analysis unit 84 is in data communication with the other units, in particular the gradient system interface 16 or the sequence control unit 14. The controller 80 comprises a plurality of units for defining or determining different variables. On the one hand, the controller 80 generates, and transfers to the gradient system interface 16 and the sequence control unit 14, suitable pulse sequence successions PSS(k). On the other hand, the controller 80 receives via a radiofrequency receive apparatus 82 raw data RD, which forms the basis of an image reconstruction by the analysis unit 84.

The central controller 80 can be operated via a terminal 11 having an input unit 10 and a display unit 9, by means of which an operator can hence also operate the entire magnetic resonance imaging system 1. Magnetic resonance images can also be displayed on the display unit 9, and it is possible to use the input unit 10, if applicable in combination with the display unit 9, to plan and start measurements, and in particular to select and, if applicable, modify control protocols P.

Furthermore, the magnetic resonance imaging system 1 according to the disclosure and in particular the controller 80 can also have a multiplicity of further components, which are not presented here in detail but are typically present in systems of this type, for instance components such as a network interface for connecting the entire system to a network and for allowing the transfer of raw data and/or image data and/or parameter maps, but also other data such as patient-related data or control protocols, for example.

Finally, it shall be reiterated that the methods and assemblies described in detail above are merely exemplary aspects, and that the basic principle can also be modified in many aspects by a person skilled in the art without departing from the scope of the disclosure insofar as this is defined by the claims. Furthermore, the method described is also not limited to medical uses. It is mentioned for the sake of completeness that the use of the indefinite article "a" or "an" does not rule out the possibility of there also being more than one of the features concerned. Likewise, the term "unit"

does not exclude the possibility that said unit consists of a plurality of components, which may also be spatially distributed if applicable.

The invention claimed is:

1. A magnetic resonance (MR) fingerprinting method performed by a controller of an MR imaging apparatus, the controller having a control unit, a raw-data acquisition interface, and an analysis unit, the MR fingerprinting method comprising:
repeatedly outputting, by the control unit of the MR imaging apparatus, an MR pulse sequence succession,
wherein the MR pulse sequence succession comprises a plurality of MR pulse sequences of the same type, which are output successively in time and differ in terms of at least one pulse sequence parameter that is varied according to a predefined scheme,
wherein during a first output of the MR pulse sequence succession, raw data from a region of interest of an object under examination is acquired in a short time interval by the raw data being acquired at a low information density, and
wherein the total information density of the acquisition is increased with each repetition of the output of the MR pulse sequence succession;
reconstructing, by the analysis unit, image data from the region of interest on the basis of the acquired raw data;
determining, by the analysis unit, MR-parameter value datasets associated with reference image data, which datasets comprise a plurality of MR parameter values, by comparing the reconstructed image data with the reference image data; and
producing, by the analysis unit for display, a plurality of MR parameter maps on the basis of the determined MR parameter values.

2. A controller for a magnetic resonance (MR) imaging apparatus, comprising:
a control unit configured for repeated output of an MR pulse sequence succession,
wherein the MR pulse sequence succession comprises a plurality of MR pulse sequences of the same type, which are output successively in time and differ in terms of at least one pulse sequence parameter, wherein the at least one pulse sequence parameter is varied according to a predefined scheme, and
a raw-data acquisition interface configured for acquisition of raw data, during the MR pulse sequence successions, from a region of interest of an object under examination in a short time interval and at a low information density, wherein the information density of the acquisition increased with each repetition of the output of the MR pulse sequence succession;
a reconstructor configured to reconstruct image data from the region of interest on the basis of the acquired raw data;
a comparator configured to determine MR-parameter value datasets associated with reference image data, which datasets comprise a plurality of MR parameter values, by comparing the reconstructed image data with the reference image data; and
a map generator configured to produce for display a plurality of MR parameter maps on the basis of the determined MR parameter values.

3. The MR fingerprinting method as claimed in claim 1, wherein the time interval for at least one repetition of the output of the MR pulse sequence succession is extended.

4. The MR fingerprinting method as claimed in claim 1, wherein the region of interest is monitored for a movement that disturbs the acquisition of the raw data.

5. The MR fingerprinting method as claimed in claim 1, wherein the image data from the region of interest is reconstructed on the basis of the raw data acquired without disturbance.

6. The MR fingerprinting method as claimed in claim 1, wherein the low information density during the first output of the MR pulse sequence succession is achieved by confining the acquisition of the raw data to low frequencies in k-space.

7. The MR fingerprinting method as claimed in claim 1, wherein confining to the low frequencies in k-space is achieved by shortening a sampling trajectory in k-space.

8. The MR fingerprinting method as claimed in claim 1, wherein confining to low frequencies in k-space is achieved by increased undersampling of k-space.

9. The MR fingerprinting method as claimed in claim 1, wherein the reference image data is adjusted to the lower information density by acquiring the reference image data at an image density equal to the information density of the particular output cycle.

10. The MR fingerprinting method as claimed in claim 1, wherein the short time interval for the acquisition of the raw data is achieved by reducing the repetition time (TR) of the individual MR pulse sequences.

11. The MR fingerprinting method as claimed in claim 1, wherein the monitoring of the region of interest is performed by simultaneous monitoring during the acquisition of the raw data.

12. The MR fingerprinting method as claimed in claim 1, wherein the region of interest is monitored retrospectively on the basis of the acquired raw data.

13. The MR fingerprinting method as claimed in claim 1, wherein:
a spiral trajectory in k-space is sampled in order to acquire the raw data,
for a reduction in the information density, the trajectory is shortened, and/or
the number of sequentially acquired spiral arms is reduced.

14. The MR fingerprinting method as claimed in claim 1, wherein one of the following trajectories is sampled in order to acquire the raw data: a Cartesian trajectory or a radial trajectory.

15. The MR fingerprinting method as claimed in claim 1, wherein the information density of the acquisition is changed by adjusting the number of pulse sequences in a pulse sequence succession, and the number of pulse sequences per pulse sequence succession is increased for a higher information density.

16. The MR fingerprinting method as claimed in claim 1, wherein the MR parameter values comprise one of the following parameter types: the T1 relaxation time; the T2 relaxation time; the susceptibility; the magnetization transfer;
the B0-field inhomogeneity; diffusion coefficient; or the off-resonance frequency.

17. A non-transitory computer-readable medium, on which are stored program segments which can be downloaded and executed by a processor in order to perform the steps of a method as claimed in claim 1 when the program segments are executed by the processor.

18. The MR fingerprinting method as claimed in claim 1, wherein the short time interval is short relative to a conventional MRF procedure, and the low information density is low relative to the conventional MRF procedure.

19. A magnetic resonance system comprising a main magnetic field system, an RF transmit antenna system, a gradient system, an RF receive antenna system, and a controller as claimed in claim 2 for controlling the main magnetic field system, the RF transmit antenna system, the gradient system and the RF receive antenna system.

20. The controller for the MR imaging apparatus of claim 2, wherein the short time interval is short relative to a conventional MRF procedure, and the low information density is low relative to the conventional MRF procedure.

* * * * *